(12) United States Patent
Tu et al.

(10) Patent No.: US 6,518,802 B1
(45) Date of Patent: Feb. 11, 2003

(54) CIRCUITS AND METHODS FOR GENERATING AN ACCURATE DIGITAL REPRESENTATION OF A SINUSOIDAL WAVE

(75) Inventors: Dan Q. Tu, San Diego, CA (US); Louis F. Coffin, III, Mountain View, CA (US)

(73) Assignee: Webtv Networks, Inc., Mountain View, CA (US)

( * ) Notice: Subject to any disclaimer, the term of this patent is extended or adjusted under 35 U.S.C. 154(b) by 0 days.

(21) Appl. No.: 09/893,054

(22) Filed: Jun. 27, 2001

(51) Int. Cl.[7] .............................................. H03B 21/00
(52) U.S. Cl. ....................... 327/106; 327/119; 327/129; 708/275; 331/57
(58) Field of Search ................................ 327/105, 106, 327/107, 113–115, 117, 129, 165, 166; 331/48, 51, 57; 375/308, 362; 708/270, 271, 272, 275–277, 421, 101–103; 377/54, 47; 455/260

(56) References Cited

U.S. PATENT DOCUMENTS

| 5,363,443 A | * | 11/1994 | Petty ........................... 379/418 |
| 5,936,438 A | * | 8/1999 | Whikehart et al. ......... 327/106 |
| 6,167,102 A | * | 12/2000 | Hellberg ..................... 375/376 |

* cited by examiner

Primary Examiner—Timothy P. Callahan
Assistant Examiner—Minh Nguyen
(74) Attorney, Agent, or Firm—Workman, Nydegger & Seeley

(57) ABSTRACT

A numerically controlled oscillator that generates an accurate digital representation of a repeating waveform such as a sinusoidal wave. Based on the desired output frequency, multiple samples are calculated from multiple cycles of the repeating waveform. As samples are taken, they are stored in a memory location until a sufficient number of samples are accumulated. After the samples are accumulated, they are output in a specified order, which generates an accurate digital representation of a sinusoidal wave at the desired output frequency.

15 Claims, 4 Drawing Sheets

Numerically Controlled Oscillator

CIRCUITS AND METHODS FOR GENERATING AN ACCURATE DIGITAL REPRESENTATION OF A SINUSOIDAL WAVE

BACKGROUND OF THE INVENTION

1. The Field of the Invention

The present invention relates to numerically controlled oscillators. More specifically, the invention relates to a numerically controlled oscillator for accurately outputting digital representations of sinusoidal waves.

2. Background and Related Art

Numerically controlled oscillators (NCOs) are used to output digital representations of sinusoidal waves at a specified output frequency. Typically, an NCO receives a digital input called a "frequency word" from which the desired output frequency may be determined. Historically, the maximum output frequency of NCOs has been limited to half of the sampling frequency. For example, a conventional NCO with a system clock (which is used as a measure of the maximum sampling rate) operating at 130 MHz could not accurately generate a sinusoidal wave having a frequency greater than 65 MHz.

FIG. 1 illustrates the structure of a conventional NCO that generates a digital representation of a sinusoidal wave. As shown in FIG. 1, sample phase generator 100 includes delay 101, summer 102, and bit select 103. Sample phase generator 100 receives system clock 105 and frequency word 106 as inputs. System clock 105 operates at a certain frequency, which is the maximum sampling frequency of the NCO. Frequency word 106 is a configurable parameter used to specify the desired output frequency.

In operation, summer 102 receives frequency word 106 and the previous value from delay 101 as inputs. Each time system clock 105 clocks, the output from summer 102 is input into bit select 103 and back into delay 101. Bit select 103 outputs the 8 most significant bits of the signal output from summer 102.

If coupled to a conventional digital-to-analog converter (DAC), the output from bit select 103, as plotted with time, would be a stepped saw tooth waveform with a frequency equal to the selected output frequency. An example of this is saw tooth waveform 107. However, a saw tooth waveform is typically not useful, and most NCOs include circuitry, such as conversion circuitry 104, that converts saw tooth waveform data into data that may be used to generate a more useful repeated waveform. The value output from the sample phase generator 100 represents the phase value of the more useful repeated waveform. The conversion circuitry 104 then generates the value of the repeated waveform at that phase value. Such conversion circuitry may convert saw tooth waveform data into digital sinusoidal waveform data (represented generally by sinusoidal waveform 108), which represents the output of the NCO. When the output of the conversion circuitry 104 is sent to a DAC, the DAC will output a stepwise approximation of a sinusoidal wave at the desired output frequency.

Conversion circuitry 104 may be, for example, a sine/cosine lookup table. In this instance, conversion circuitry 104 would include a series of entries that correspond to samples of a sinusoidal wave. In FIG. 1, the eight-bit output from sample phase generator 100 may have 256 (i.e., $2^8$) possible phase values. Accordingly, the lookup table would have 256 possible output values corresponding to the 256 possible input values. Limiting the lookup table to 256 possible output values decreases the size of the NCO as compared to NCOs that have lookup tables of more refined resolution. For example, if all 17 bits of the output from summer 102 were provided to the conversion circuitry 104, the conversion circuitry need to handle $2^{17}$ (i.e., 131,072) different input permutations using 131,072 different entries. This kind of lookup table would typically be too large to be practical.

The output repeated waveform has a frequency spectrum with a strong line at the desired output frequency, but also includes lines that are separated from multiples of the clock frequency by plus or minus the desired output frequency. For example, if an NCO with a system clock of 130 MHz were used to generate a sinusoidal wave at 15 MHz, the output would also include a strong frequency component at 15 MHz. However, there would also be frequency components at 145 MHz (i.e., 130 MHz plus 15 MHz) and 115 MHz (i.e., 130 MHz minus 15 MHz) and smaller frequency components at 275 MHz (i.e., 2 times 130 MHz plus 15 MHz) and 245 MHz (i.e., 2 times 130 MHz minus 15 MHz), and so forth. Typically, such spurious frequency components may be removed using a low pass filter with a sharp cutoff below half of the clock frequency.

As the desired output frequency rises, the unwanted frequency that occurs at the clock frequency minus the desired output frequency draws closer to the desired output frequency. For example, if the clock frequency was 130 MHz and the desired output frequency was 60 MHz, there would be a spurious frequency component at 70 MHz (i.e., 130 MHz minus 60 MHz). The desired output frequency and the lowest spurious frequency component meet when the desired output frequency equals half of the clock frequency. In the example of an NCO with a system clock of 130 MHz, this would occur when the desired output frequency was 65 MHz. When this occurs, even a low pass filter with a very sharp cutoff cannot be used to remove spurious frequency components, because such a filter would remove desired frequency components as well. Thus, a digital representation of a sinusoidal wave at half the clock frequency or greater will not be sufficiently accurate.

Current technology limits clock rates on NCOs to around 200 MHz. This limits the output frequency of accurately generated sinusoidal waves to around 100 MHz. However, in many instances, it would be of benefit to accurately generate a digital representation of a sinusoidal wave with an output frequency higher than 100 MHz. In the case of NCOs, which do not employ the latest technology, and thus have slower clock rates, it would also be of benefit to accurately generate digital representations of sinusoidal waves at greater than one half the frequency of the clock frequency. For example, one might want to generate a 100 MHz sinusoidal wave using an NCO with a system clock of 130 MHz.

Therefore, what are desired are systems and methods for accurately generating a digital representation of a sinusoidal wave at greater than half the frequency of the sampling or clock frequency.

SUMMARY OF THE INVENTION

In accordance with the present invention, an NCO receives data representing digital samples of a sinusoidal wave at the desired output frequency. When a digital representation of a sinusoidal wave is to be generated at a desired output frequency that is near to or greater than one half the sampling rate, the samples are calculated over multiple cycles of the sinusoidal wave. The calculated samples are then stored in a circular shift register. The number of samples to be taken and the number of cycles over which the samples are accumulated are calculated using the sampling rate (system clock frequency) and the desired output frequency.

First, a greatest common factor of the sampling rate and specified frequency is calculated. For instance, if the sampling rate was 130 MHz and the specified frequency was 100 MHz, the greatest common factor would be 10. The number of samples that are to be buffered is calculated by dividing the sampling rate by the greatest common factor. In the given example, if the sampling rate was 130 MHz and the greatest common factor was 10, the number of samples would be thirteen. Also, the number of cycles over which the samples will be accumulated is calculated by dividing the desired output frequency by the greatest common factor. Returning to the example, if the desired output frequency is 100 MHz and the greatest common factor is 10, it will take ten cycles for the thirteen samples to be accumulated.

In the example, thirteen samples will be calculated over a period of ten cycles and the thirteen samples will be stored in a circular shift register. In the example, since ten is a whole number, the value of samples from subsequent groups of ten cycles would be identical to those values sampled from the first ten cycles assuming no change in the desired output frequency. Since the sample values would be identical, once the first thirteen sample values are stored, no other sampling need be done. To output digital representations of a sinusoidal wave at 100 MHz, the thirteen stored values would be sequentially output to generate a sinusoidal waveform at the desired output frequency. This may continue until the NCO detects a change in the desired output frequency.

Using the present invention, digital representations of sinusoidal waves may be accurately generated even when the desired output frequency is greater than one half of the sampling frequency. Also, the present invention is beneficial because it does not require many of the circuitries used in the conventional NCO implementation. Instead, the NCO in accordance with the present invention may use a system clock with a circular shift register. The values stored in the circular shift register may be pre-calculated and stored in the circular shift register, thus eliminating the requirement for a sample phase generator and conversion circuitry. In this manner, the principles of the present invention significantly reducing the complexity and size requirements of an NCO as compared to the conventional NCO implementation, while allowing for reliable generation of sinusoidal waves at greater than one half the sampling frequency.

Additional features and advantages of the invention will be set forth in the description which follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE INVENTION

The present invention extends to both circuits and methods for accurately generating a digital representation of a sinusoidal wave even where the desired output frequency is greater than one half of the sampling frequency.

Figure 1:
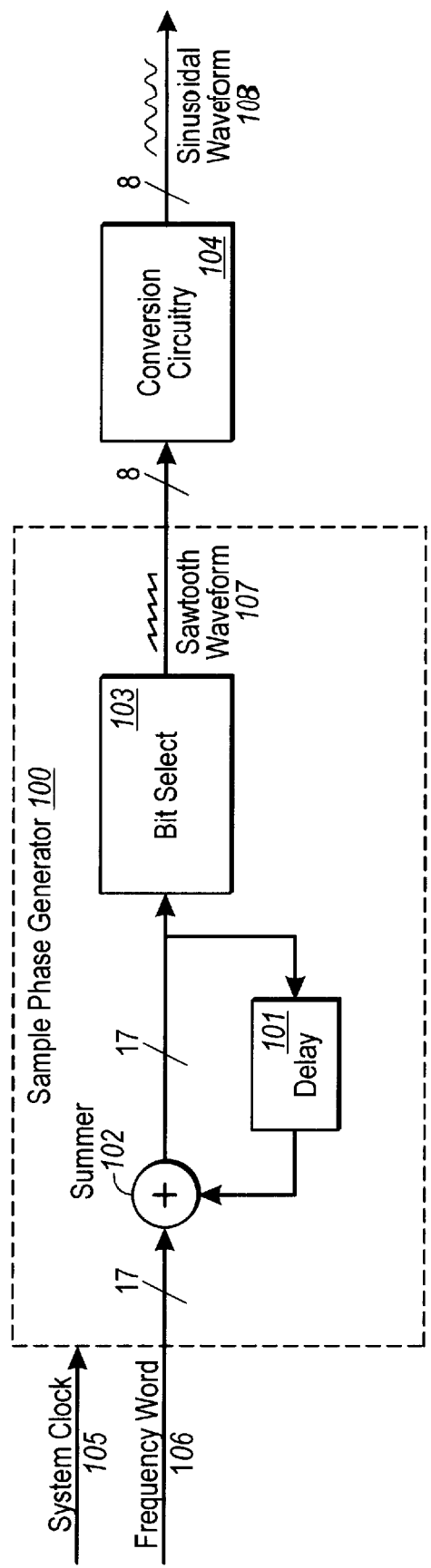
FIG. 1 is a block diagram illustrating some of the components and functionality of a conventional Numerically Controlled Oscillator.
Figure 2:
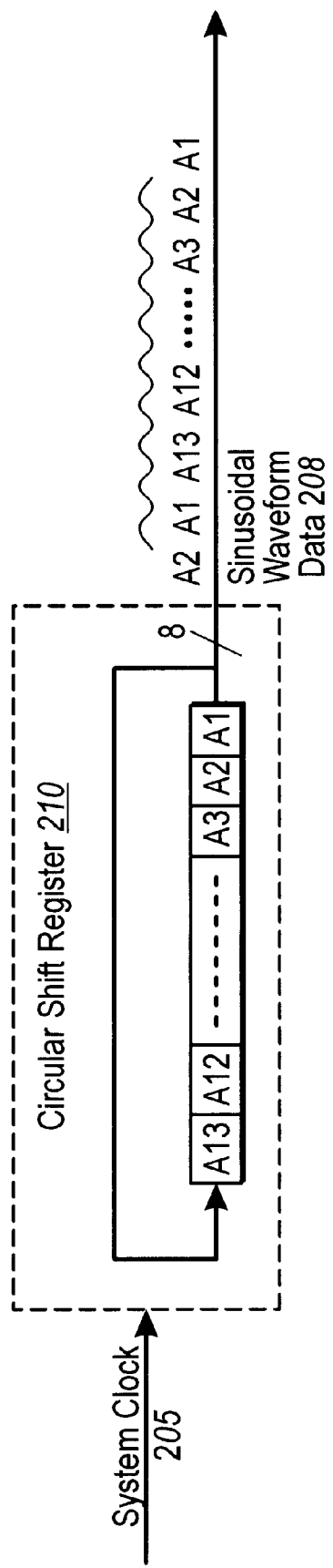
FIG. 2 is a block diagram illustrating some of the components and functionality that may be included in a Numerically Controlled Oscillator that embodies the present invention.
Figure 3:
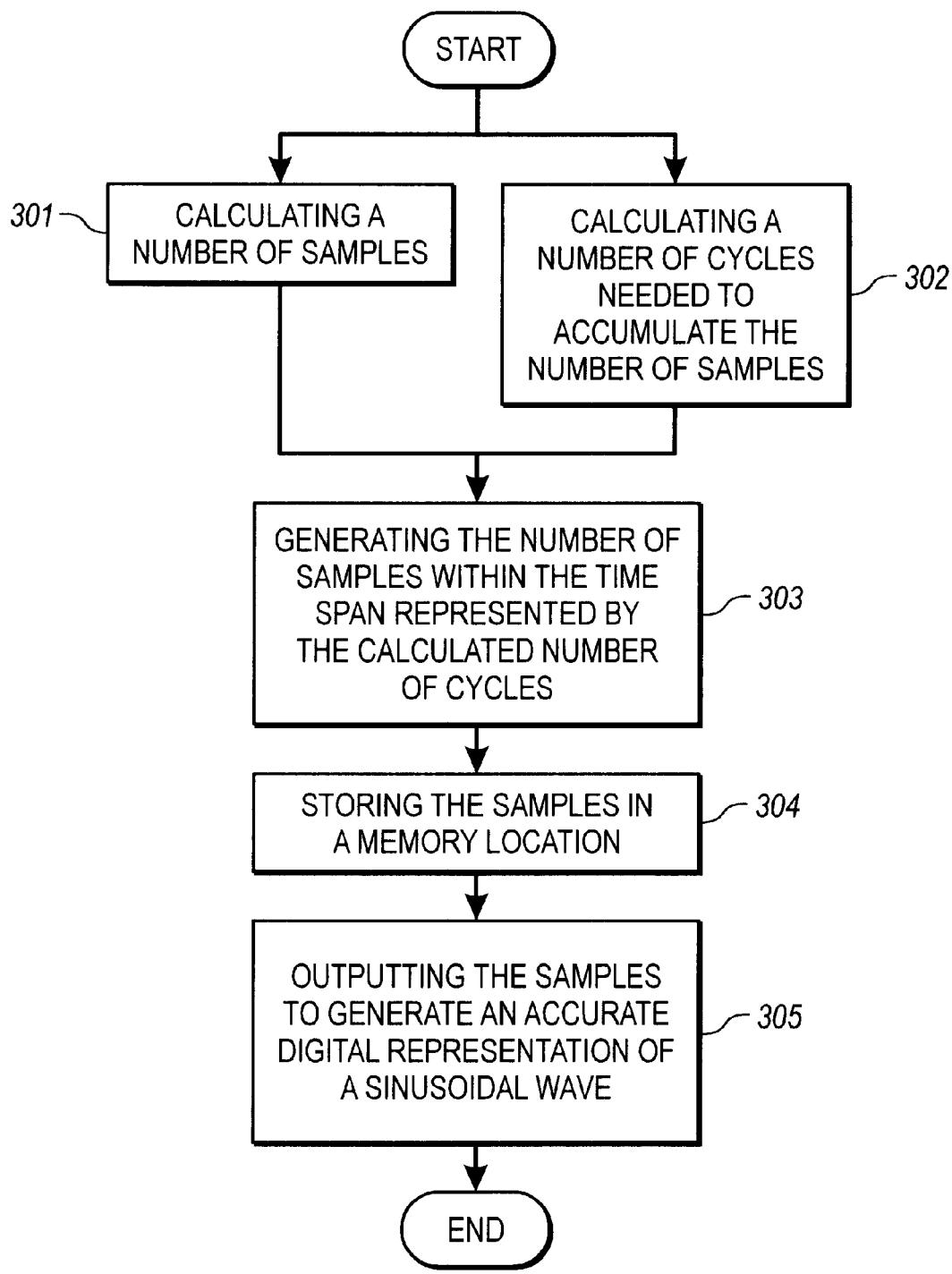
FIG. 3 is a flow diagram illustrating a method whereby a digital representation of a sinusoidal wave may be generated.

Referring now to the figures, FIG. 2 is block diagram illustrating one embodiment of the present invention and FIG. 3 is a flow diagram illustrating a method whereby a digital representation of a sinusoidal wave may be generated in accordance with the present invention. In the following description of the present invention, reference will be frequently made to both FIG. 2 and FIG. 3.

While illustrated embodiments of the present invention refer specifically to sinusoidal waves, it should be recognized that the present invention might also be used to generate digital representations of other types of repeating waveforms. Examples of such repeating waveforms include saw tooth waves, square waves, triangle waves, or any other waveform in which a series of values is repeated within a finite period of time.

FIG. 2 illustrates some of the components that may be included in an NCO, which embodies the present invention. The NCO includes a circular shift register 210 that stores a number of sequential samples of a sinusoidal waveform. The NCO receives system clock signal 205 and outputs one sample every clock cycle. The value of the samples may be calculated using the desired output frequency of the sinusoidal waveform, and the sample frequency (in this case, the system clock frequency). In one embodiment, the sample values are pre-calculated as described below with respect to act 301, act 302 and act 303 of FIG. 3.

In FIG. 3, as illustrated in acts 301 and 302, the method calculates a number of samples (act 301) and a number of cycles over which the number of samples will be accumulated (act 302). The number of samples may be calculated by dividing the sampling rate, which may be the frequency of system clock 205, by the greatest common factor of the sampling rate and a desired output frequency.

The number of cycles needed to accumulate the number of samples may be calculated by dividing the desired output frequency by the greatest common factor of the sampling rate and the desired output frequency. For example, in an NCO including system clock 205 operating at 130 MHz, assume that the NCO of FIG. 2 is to generate a desired output frequency of 100 MHz. The greatest common factor between 100 MHz and 130 MHz is 10 MHz. Dividing 130 MHz by 10 MHz results in 13. This means that 13 samples will need to be taken. Dividing 100 MHz by 10 MHz results in 10. This means that 10 cycles are needed to accumulate the 13 samples.

In act 303, the method generates the number of samples within the time span represented by the number of cycles. This may be accomplished, for example, by determining the total phase of the cycles over which samples are to be taken and dividing by the number of samples. For example, if there were ten cycles, the total phase would be $20\pi$ radians (i.e., 10 cycles times $2\pi$ radians/cycle). Thus, the division would be $20\pi$ radians divided by 13 samples resulting in a phase change of approximately $1.538\pi$ radians per sample. Then, the sine values for the corresponding phases are calculated. Table 1 shows the samples that would be calculated when a system with a 130 MHz clock is used to generate a desired output frequency of 100 MHz.

TABLE 1

| Memory Location | Sample Number | Absolute Phase | Relative Phase | Sine Value |
| --- | --- | --- | --- | --- |
| A1  | 1  | 0 | 0 | 0 |
| A2  | 2  | $(10/13)*2\pi = 1.538\pi$ | $1.538\pi$ | −0.993 |
| A3  | 3  | $(20/13)*2\pi = 3.077\pi$ | $(3.077\pi - 2\pi) = 1.077\pi$ | −0.239 |
| A4  | 4  | $(30/13)*2\pi = 4.615\pi$ | $(4.615\pi - 4\pi) = 0.615\pi$ | +0.935 |
| A5  | 5  | $(40/13)*2\pi = 6.154\pi$ | $(6.154\pi - 6\pi) = 0.154\pi$ | +0.465 |
| A6  | 6  | $(50/13)*2\pi = 7.692\pi$ | $(7.692\pi - 6\pi) = 1.692\pi$ | −0.823 |
| A7  | 7  | $(60/13)*2\pi = 9.231\pi$ | $(9.231\pi - 8\pi) = 1.231\pi$ | −0.663 |
| A8  | 8  | $(70/13)*2\pi = 10.769\pi$ | $(10.769\pi - 10\pi) = 0.769\pi$ | +0.663 |
| A9  | 9  | $(80/13)*2\pi = 12.308\pi$ | $(12.308\pi - 12\pi) = 0.308\pi$ | +0.823 |
| A10 | 10 | $(90/13)*2\pi = 13.846\pi$ | $(13.846\pi - 12\pi) = 1.846\pi$ | −0.465 |
| A11 | 11 | $(100/13)*2\pi = 15.385\pi$ | $(15.385\pi - 14\pi) = 1.385\pi$ | −0.935 |
| A12 | 12 | $(110/13)*2\pi = 16.923\pi$ | $(16.923\pi - 16\pi) = 0.923\pi$ | +0.239 |
| A13 | 13 | $(120/13)*2\pi = 18.462\pi$ | $(18.462\pi - 18\pi) = 0.462\pi$ | +0.993 |

Memory Locations and Values of Samples as Received

Referring to Table 1, the memory location column represents the corresponding memory location in circular shift register 210. The phase values are the phase of the calculated sample. The first sample number is assumed to have a phase of zero. After samples are calculated, they are stored in a memory location (act 304) such as memory locations A1 through A13 of circular shift register 210.

Once these values are stored, the NCO is configured to output the digital representation of the sinusoidal wave at the desired output frequency. Specifically, one sample is output every clock cycle starting with the value in memory location A1, then A2 and so on until A13, at which point the output returns back to A1 to repeat the process (see sinusoidal waveform data 208 of FIG. 2). In this manner, the samples are output to generate an accurate representation of a sinusoidal wave (act 305).

By repeating the sampled output in this manner, a surprising result is obtained. Specifically, the forced repetition of the sampled values results in an output waveform that has strong frequency components at the desired output frequency. The following is the text of a MATLAB® program that illustrates this principle.

1) ph(1:2100)=0;
2) ph(1:13)=pi*[0 1.538 1.077 0.615 0.154 1.692 1.231 0.769 0.308 1.846 1.385 0.923 0.462];
3) for i=14:2100
4) m=mod(i,13);
5) if m==0
6) ph(i)=ph(13);
7) else
8) ph(i)=ph(mod(i,13));
9) end
10) end
11) for k=1:2100
12) y sin(k)=sin(ph(k));
13) end
14) y sin_8=round(y sin.*2^8);
15) y sin_8_fft=fft(y sin_8,2048);
16) y sin_8_norm=10*log((abs(y sin_8_fft))/max (abs(y sin_8_fft))
17) for i=1:2048
18) if i<=2048/2
19) f(i)=(i−1)*(130e6/(2048*pi));
20) else
21) f(i)=i* (130e6/(2048*pi))−130e6/pi;
22) end
23) end
24) plot(f,y sin_8_norm,'b-');

In this program, "ph" is a vector of phase values in which the thirteen relative phase values of Table 1 are repeated every ten cycles of the repeated waveform. Line 1 initializes 2100 sample values of the vector "ph" to zero. Line 2 assigns the first thirteen values of vector "ph" to the thirteen relative phase values from Table 1. Line 3 through line 10 assigns the remaining values of the phase vector "ph" so that the thirteen values are repeated in accordance with the principles of the present invention. Line 11 through line 13 assigns a corresponding sine value for each phase value of the vector "ph" to form a sine value vector "y sin". Line 14 assigns an 8-bit quantized version of each sine value for the vector "y sin" to a new vector "y sin_8". Line 15 assigns a corresponding discrete Fourier transform value of the vector "y sin_8" to new vector "y sin_8_fft" that represents the frequency components of the vector "y sin_8". Line 16 normalizes the vector "y_sin_fft" to a new normalized frequency vector "y sin_8_norm". Lines 18 through 23 assign frequency values to a vector "f". Line 24 plots the normalized frequency spectrum in decibels represented by "y sin_8_norm" on the vertical axis with frequency in Hz on the horizontal axis.

Figure 4:
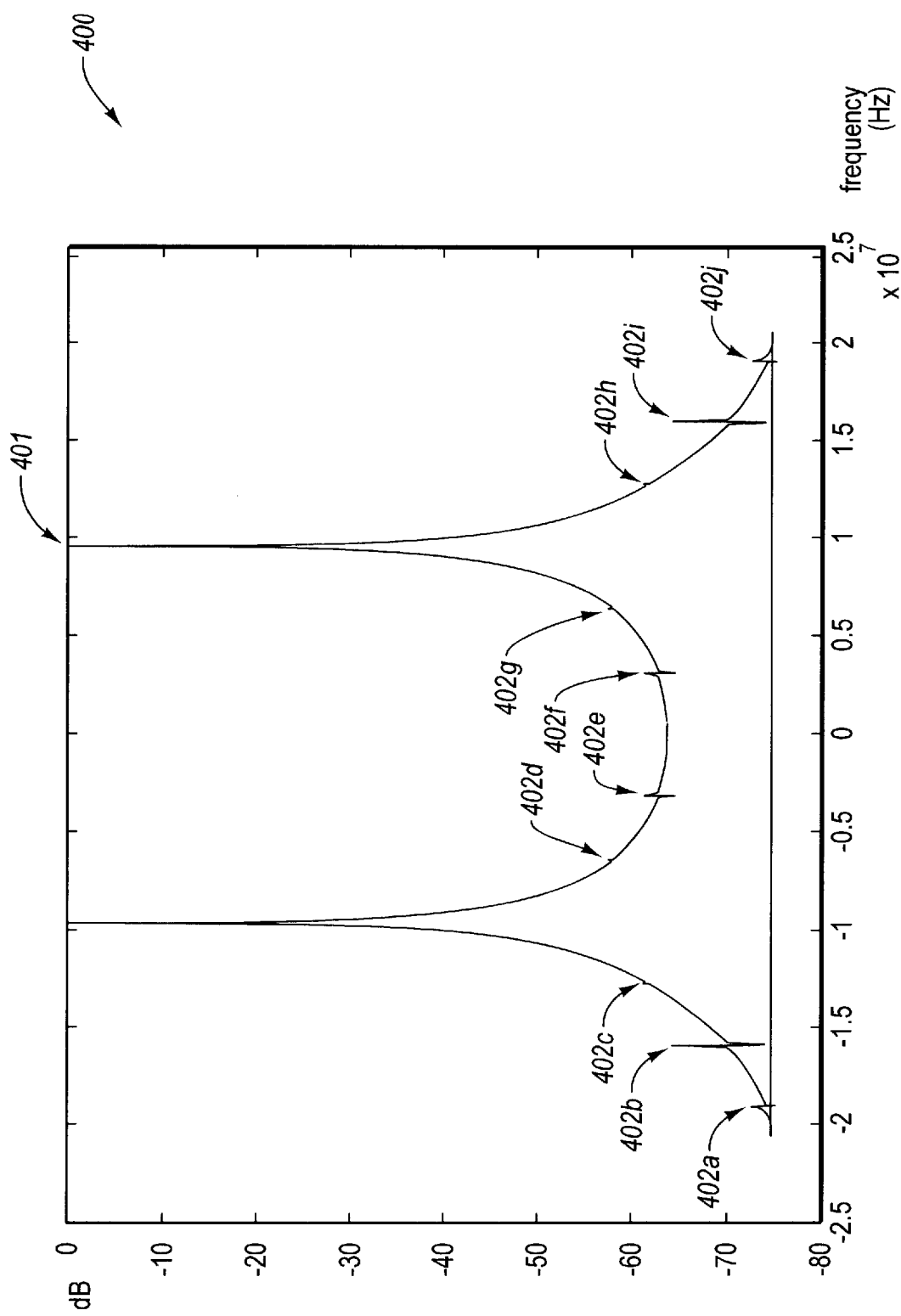
FIG. 4 illustrates a simulation plot of frequency spectrum generated by the Numerically Controlled Oscillator of FIG. 2.

The plot generated by line 24 is illustrated by the plot 400 of FIG. 4. As illustrated in FIG. 4, there is a strong frequency component exactly at 100 MHz, the desired output frequency, despite having a sampling frequency of only 130 MHz. As one varies from the desired output frequency, the signal power substantially diminishes. The anomalies at 402a through 402j are generated by the 8-bit quantization of the sine values. FIG. 4 makes clear that by sampling a fixed number of cycles a fixed number of times, the NCO of FIG. 2 may obtain a clear sinusoidal signal at 100 MHz, well over half the clock frequency of 130 MHz.

In addition to producing an accurate sinusoidal wave at more than one half of the sampling frequency, the principles of the present invention also allow for a much smaller design of the NCO. Essentially, all of the components of the conventional NCO are replaced with a circular shift register coupled to a clock input signal and having specially calculated values stored in the circular shift register.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes, which come within the meaning and range of equivalency of the claims, are to be embraced within their scope.

What is claimed and desired to be secured by United States Letters Patent is:

1. A method for generating an accurate digital representation of a sinusoidal wave at a specified frequency, the digital representation having a sampling rate, the method comprising:
    calculating a number of samples to be taken;
    calculating a number of cycles needed to take the number of samples;
    generating samples of a sinusoidal wave, equal to the number of samples, within the time span represented by the calculated number of cycles; and
    causing the samples to be stored in a single register that is configured to output the samples in a circular shift pattern in response to a clock signal.

2. A method as recited in claim 1, further comprising:
    outputting the samples from the single register in the circular shift pattern to generate an accurate digital representation of a sinusoidal wave at the specified frequency.

3. The method as recited in claim 1, wherein calculating the number of samples to be taken, comprises the following:
    dividing the sampling rate by the greatest common factor of the sampling rate and the specified frequency.

4. The method as recited in claim 1, wherein calculating a number of cycles needed to take the number of samples, comprises the following:
    dividing the specified frequency by the greatest common factor of the sampling rate and the specified frequency.

5. The method as recited in claim 1, wherein causing the samples to be stored in a single register comprises the following:
    storing the samples in a register that is included as part of a numerically controlled oscillator.

6. A numerically controlled oscillator configured to receive a system clock signal representing a sample rate, and configured to provide a digital representation of a sinusoidal waveform at a desired output frequency, the numerically controlled oscillator comprising:
    a clock signal input line configured to carry a clock signal;
    a single circular shift register that is configured to store a plurality of samples representing a sinusoidal wave, the circular shift register also configured to repeatedly output the samples in a circular shift pattern in response to the clock signal, wherein the circular shift register comprises:
        a first memory location storing a first sample value that represents the sinusoidal wave at a first phase;
        a second memory location storing a second sample value that represents the sinusoidal wave at a second phase; and
        a circuit that is configured to calculate a number of samples to be taken, calculate a number of cycles needed to take the number of samples, generate samples of the sinusoidal wave equal to the number of samples within the time span represented by the calculated number of cycles, and cause the samples to be stored in at least the first and second memory location of the single circular shift register.

7. A numerically controlled oscillator in accordance with claim 6, wherein the circular shift register further comprises:
    a third memory location storing a third sample value that represents the sinusoidal wave at a third phase between the first and second phases.

8. A numerically controlled oscillator in accordance with claim 6, wherein the first and second sample values are from a plurality of cycles of the sinusoidal wave.

9. A method for generating am accurate digital representation of a repeating waveform at a specified frequency, the digital representation having a sampling rate, the method comprising:
    calculating a number of samples to be taken;
    calculating a number of cycles needed to take the number of samples;
    generating samples of a repeating waveform, equal to the number of samples, within the time span represented by the calculated number of cycles; and
    causing the samples to be stored in a single register that is configured to output the samples in a circular shift pattern in response to a clock signal.

10. A method as recited in claim 9, further comprising:
    outputting the samples from the single register in the circular shift pattern to generate an accurate digital representation of the repeating waveform at the specified frequency.

11. The method as recited in claim 9, wherein calculating a number of samples to be taken comprises the following:
    dividing the sampling rate by the greatest common factor of the sampling rate and the specified frequency.

12. The method as recited in claim 9, wherein calculating a number of cycles needed to take the number of samples, comprises the following:
    dividing the specified frequency by the greatest common factor of the sampling rate and the specified frequency.

13. A numerically controlled oscillator configured to receive a system clock signal representing a sample rate, and configured to provide a digital representation of a repeating waveform at a desired output frequency, the numerically controlled oscillator comprising:
    a clock signal input line configured to carry a clock signal;
    a single circular shift register that is configured to store a plurality of samples representing a repeating waveform, the circular shift register also configured to repeatedly output the samples in a circular shift pattern in response to the clock signal, wherein the circular shift register comprises:
        a first memory location storing a first sample value that represents the repeating waveform at a first phase; and a second memory location storing a second sample value that represents the repeating waveform at a second phase; and a circuit that is configured to calculate a number of samples to be taken, calculate a number of cycles needed to take the number of samples, generate samples of the repeating waveform equal to the number of samples within the time span represented by the calculated number of cycles, and cause the samples to be stored in at least the first and second memory location of the single circular shift register.

14. A numerically controlled oscillator in accordance with claim 13, wherein the circular shift register further comprises:

a third memory location storing a third sample value that represent the repeating waveform at a third phase between the first and second phases.

15. A numerically controlled oscillator in accordance with claim 13, wherein the first and second sample values are from a plurality of cycles of the repeating waveform.

* * * * *

UNITED STATES PATENT AND TRADEMARK OFFICE
CERTIFICATE OF CORRECTION

PATENT NO.     : 6,518,802 B1
DATED          : February 11, 2003
INVENTOR(S)    : Tu et al.

It is certified that error appears in the above-identified patent and that said Letters Patent is hereby corrected as shown below:

Column 8,
Line 25, after "generating" please delete "am" and insert -- an --

Signed and Sealed this

Tenth Day of February, 2004

JON W. DUDAS
*Acting Director of the United States Patent and Trademark Office*